United States Patent [19]
Ariyosi et al.

[11] Patent Number: 5,796,310
[45] Date of Patent: Aug. 18, 1998

[54] AMPLIFICATION CIRCUIT USING WIRE-BONDING FOR ADJUSTING AMPLIFICATION FACTOR

[75] Inventors: Hiromi Ariyosi, Kariya; Tameharu Ohta, Nishio, both of Japan

[73] Assignee: Denso Corporation, Kariya, Japan

[21] Appl. No.: 761,819

[22] Filed: Dec. 6, 1996

[30] Foreign Application Priority Data

Dec. 6, 1995 [JP] Japan .................................. 7-318306

[51] Int. Cl.$^6$ ...................................................... H03G 3/18
[52] U.S. Cl. ........................ 330/307; 327/516; 330/282; 330/284
[58] Field of Search ...................... 330/146, 282, 330/284, 307, 2; 73/514.33, 514.34; 280/735; 327/516

[56] References Cited

U.S. PATENT DOCUMENTS 4,641,108  2/1987  Gill, Jr. ................................ 330/307

FOREIGN PATENT DOCUMENTS 58-200510  11/1983  Japan .
61-242405  10/1986  Japan .
63-145359  9/1988  Japan .

OTHER PUBLICATIONS

Design for Operational Amplifier, pp. 383–392 see English abstract.

*Primary Examiner*—James B. Mullins
*Attorney, Agent, or Firm*—Cushman Darby & Cushman IP Group of Pillsbury Madison & Sutro LLP

[57] ABSTRACT

An amplification circuit comprises an operational amplifier, an input resistance unit and a feedback resistance unit. The input resistance unit consists of a plurality of input resistances connected in series, and the feedback resistance unit consists of a plurality of feedback resistances connected in series. A plurality of adjusting pads are provided at respective connecting points of these input and feedback resistances. There is a common pad having an electrical potential fixed at a reference voltage. A first wire selectively bonds one of adjusting pads corresponding to the input resistances with the common pad to set a resistance value of the input resistance unit. And, a second wire selectively bonds one of adjusting pads corresponding to the feedback resistances with the common pad to set a resistance value of the feedback resistance unit.

9 Claims, 3 Drawing Sheets

| P-P VALUE OF OUTPUT VOLTAGE ($G_0$) | BONDING PAD POSITION |
|---|---|
| $V_1 \leq G_0 < V_2$ | A |
| $V_2 \leq G_0 < V_3$ | a, A |
| $V_3 \leq G_0 < V_4$ | b, A |
| $V_4 \leq G_0 < V_5$ | c, A |
| $V_5 \leq G_0 < V_6$ | d, A |
| $V_6 \leq G_0 < V_7$ | B |
| $V_7 \leq G_0 < V_8$ | a, B |
| $V_{21} \leq G_0 < V_{22}$ | |
| $V_{22} \leq G_0 < V_{23}$ | a |
| $V_{23} \leq G_0 < V_{24}$ | b |
| $V_{24} \leq G_0 < V_{25}$ | c |
| $V_{25} \leq G_0 < V_{26}$ | d |

AMPLIFICATION CIRCUIT USING WIRE-BONDING FOR ADJUSTING AMPLIFICATION FACTOR

BACKGROUND OF THE INVENTION

1. Field of the Invention:

This invention relates to an amplification circuit, and more particularly to the adjustment of an amplification factor of the amplification circuit by selecting a resistance value and a sensor apparatus comprising such an amplification circuit.

2. Related Art:

When the amplification factor is adjusted by varying the resistance value, laser beam has been conventionally used for trimming the thick-film or thin-film resistance so as to change the resistance value. According to another adjusting method, the resistance value memorized in a memory, such as EPROM, can be rewritten to adjust the resistance value electrically.

However, according to the former adjusting method using laser, a significantly large-scale equipment for generating laser beam is definitely required. According to the latter adjustment relying on the electrical method, a dedicated memory is required specially. In each case, there is the problem of cost increasing.

SUMMARY OF THE INVENTION

Accordingly, in view of above-described problems encountered in the related art, a principal object of the present invention is to provide a novel and excellent resistance adjustment for the amplification factor of an amplification circuit.

In order to accomplish this and other related objects, according to the present invention, the resistance values of the resistances used for determining the amplification factor of an amplification circuit are adjusted by using wire-bonding.

Accordingly, the adjustment of the resistance values can be easily performed. Using the wire-bonding is advantageous to realize an accurate adjustment because of extremely small connecting resistances.

According to a preferred embodiment of the present invention, an amplification circuit comprises an operational amplifier, an input resistance unit and a feedback resistance unit. The input resistance unit and the feedback resistance unit cooperatively determine the amplification factor of the amplification circuit. The input resistance unit comprises a plurality of input resistances, and the feedback resistance unit comprises a plurality of feedback resistances. A plurality of adjusting pads are provided at respective connecting points of there input and feedback resistances. A common pad is provided. The electrical potential of the common pad is fixed at a reference voltage. A first wire selectively bonds one of adjusting pads corresponding to the input resistances with the common pad to set a resistance value of the input resistance unit. Similarly, a second wire selectively bonds one of adjusting pads corresponding to the feedback resistances with the common pad to set a resistance value of the feedback resistance unit.

The operational amplifier, the input resistance unit and the feedback resistance unit are arranged as an integrated circuit. The adjusting pads corresponding to the input resistances and the feedback resistances are arrayed along a line on this integrated circuit. The common pad is disposed in a confronting relationship with the line along which the plurality of adjusting pads are arrayed. Thus, the wire-bonding can be easily performed.

Furthermore, when the input resistances and/or feedback resistances are connected in series, the resistance value of the input resistance unit or the feedback resistance can be divided in proportion to the wire-bonding position.

Above-described amplification circuit can be incorporated into a sensor apparatus detecting a physical quantity. In this case, the amplification factor of the amplification circuit is adjusted so as to obtain a desirable output in response to a detection voltage of a sensor means.

Moreover, according to a method for adjusting the amplification factor of the amplification circuit incorporated in such a sensor apparatus, an output signal of the sensor apparatus is detected when the sensor means detects a predetermined physical quantity. A bonding position of the wire is determined based on the output signal with reference to a predetermined relationship between the output voltage and the bonding position. And, a wire-bonding operation is executed based on the determined bonding position.

According to the adjusting method of the present invention, the wire-bonding operation can be easily performed. Still further, the amplification factor adjustment is performed based on the actual operation of the sensor means. Hence, the setting of the amplification factor of the amplification circuit can be performed properly as an overall system comprising the sensor means.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
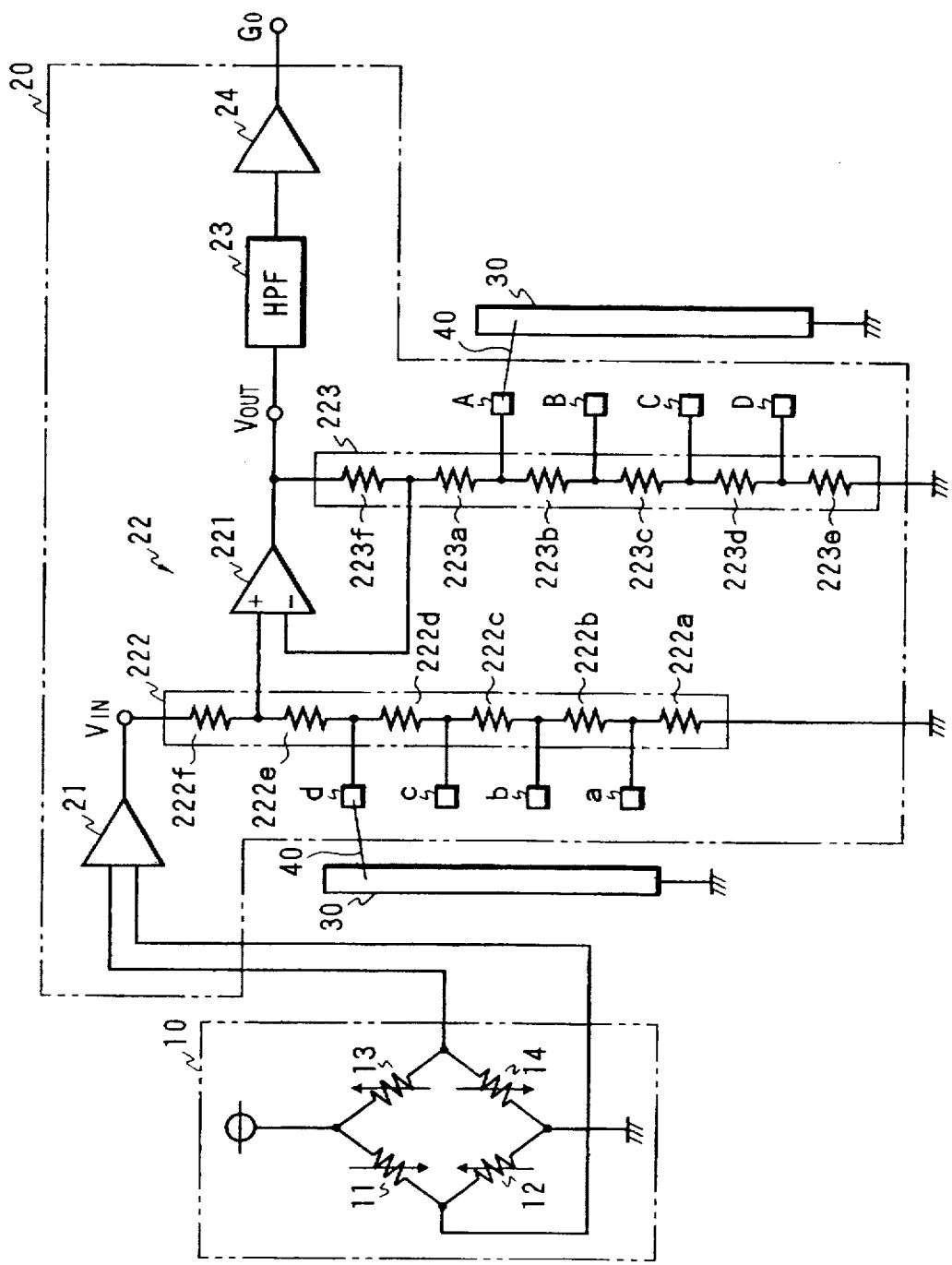
FIG. 1 is a circuit diagram showing the arrangement of an amplification circuit in accordance with a preferable embodiment of the present invention, applied to an acceleration sensor incorporated in an air bag system for an automotive vehicle.

Preferred embodiments of the present invention will be explained in greater detail hereinafter with reference to the accompanying drawings. Identical parts are denoted by the same reference numerals throughout the views.

An amplification circuit, according to a preferred embodiment of the present invention, is applied to an air bag system of an automotive vehicle. FIG. 1 shows the details circuit arrangement of the first embodiment of the present invention. The acceleration sensor shown in FIG. 1 comprises a sensor chip 10 detecting an acceleration and a signal processing section 20 associated with sensor chip 10 to process the signal obtained from sensor chip 10.

Sensor chip 10 comprises a total of four distortion gauges 11 to 14, each having a resistance value variable in response to the acceleration acting thereon. When distortion gauges 11 to 14 are subjected to any acceleration, their resistance values increase or decrease as indicated by arrows in FIG. 1. Distortion gauges 11 to 14 constitute a bridge circuit, whose midpoint causes a voltage difference in response to the increase or decrease of their resistance values. The sensor chip 10 generates a detection voltage representing the voltage difference caused at the midpoint of the bridge circuit.

Signal processing section 20 comprises a pre-stage amplification circuit 21 which amplifies the detection voltage obtained from sensor chip 10, an adjusting amplification circuit 22 which adjusts the amplification factor, an HPF (high-pass filter) 23, and a post-stage amplification circuit 24 which produces an output voltage $G_O$.

Adjusting amplification circuit 22, which is a non-inverting amplification circuit for amplifying a voltage $V_{IN}$, comprises an operational amplifier 221, an input resistance unit 222, and a feedback resistance unit 223. Input resistance unit 222 comprises a group of input resistances 222a through 222f. Feedback resistance unit 223 comprises a group of feedback resistances 223a through 223f.

Input resistances 222a though 222e are connected in series to constitute input resistance unit 222. Adjusting pads a through d are provided at respective connecting points of these serially connected input resistances 222a through 222e. Similarly, feedback resistances 223a though 223e are connected in series to constitute the feedback resistance unit 223. Adjusting pads A through D are provided at respective connecting points of these serially connected feedback resistances 223a through 223e.

The amplification factor of the amplification circuit is determined by the resistance values of the input resistance unit 222 and the feedback resistance unit 223. When the resistance values of the input resistance unit 222 and the feedback resistance 223 are adjusted, one of adjusting pads a–d is selectively wire-bonded to a common pad 30 fixed at an earth potential and also one of the other adjusting pads A–D is selectively wire-bonded to another common pad 30 fixed at an earth potential. In other words, the above-described selective wire-boding operation determines the amplification factor of amplification circuit 22 (i.e. the ratio of output voltage $V_{OUT}$/input voltage $V_{IN}$).

For example, adjusting pads A and d are selected and bonded via wires 40 to common pads 30, the amplification factor ($V_{OUT}/V_{IN}$) of the amplification circuit 22 is expressed by the following equation.

$$\frac{V_{OUT}}{V_{IN}} = \frac{R_e + R_f}{R_e} \cdot \frac{R_A}{R_A + R_F} \quad (1)$$

where $R_a$, $R_b$, $R_c$, $R_d$, $R_e$, $R_f$ represent resistance values of input resistances 222a through 222f respectively, while $R_A$, $R_B$, $R_C$, $R_D$, $R_E$, $R_F$ represent resistance values of feedback resistances 223a through 223f.

When all of adjusting pads a–d and A–D are in the opened condition where no adjusting pad is wire-bonded to the common pads 30, the amplification factor ($V_{OUT}/V_{IN}$) of the amplification circuit 22 is expressed by the following equation.

$$\frac{V_{OUT}}{V_{IN}} = \frac{R_a + R_b + R_c + R_d + R_e + R_f}{R_a + R_b + R_c + R_d + R_e} \cdot \frac{R_A + R_B + R_C + R_D + R_E}{R_A + R_B + R_C + R_D + R_E + R_F}$$

The input resistance unit 222 possesses five different resistance values selectable by opening all of adjusting pads a–d or wire-bonding one of the adjusting pads a–d. The feedback resistance unit 223 possesses five different resistance values selectable by opening all of adjusting pads A–D or wire-bonding one of the adjusting pads A–D. Accordingly, the number of possible combinations between the input resistance value and the feedback resistance value is 5×5=25 in the amplification circuit 22 of FIG. 1.

The above-described signal processing section 20 is constituted as an integrated circuit (IC). Input resistances 222a–222f and feedback resistances 223a–223f are same kind of resistances, such as thin-film resistances or diffusion resistances of CrSi. In this manner, by forming the same kinds of resistances in IC, the settings of the amplification factor can be accurately performed. The wire-bonding has an extremely small connecting resistance; therefore, the amplification factor can be accurately adjusted while maintaining small ON resistance and excellent temperature characteristics.

Figure 2:
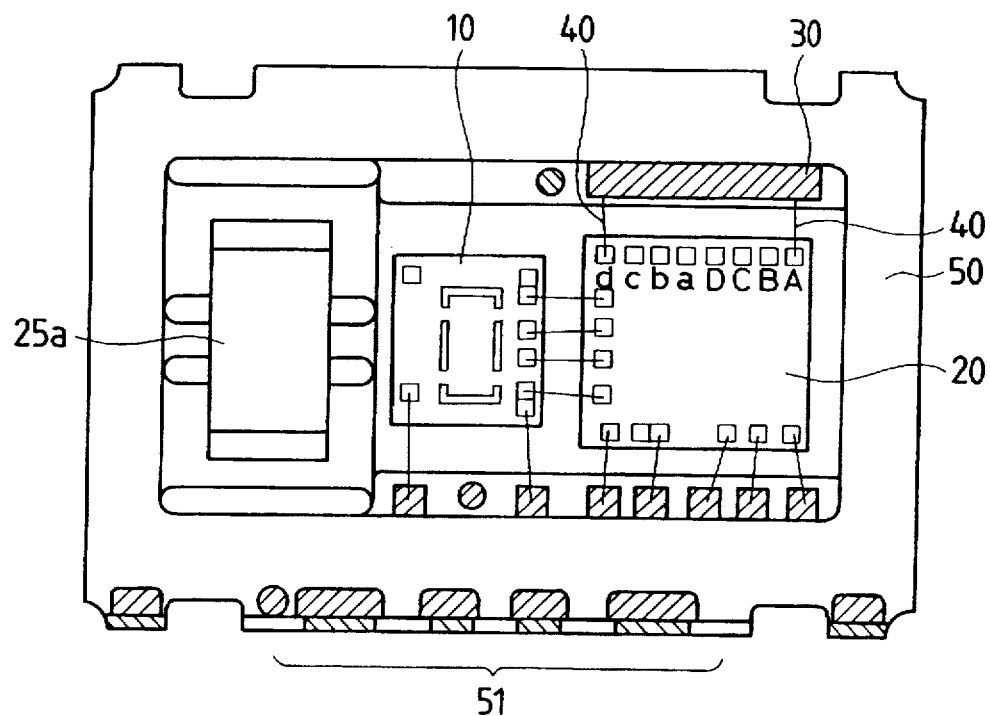
FIG. 2 is a plan view showing the acceleration sensor of FIG. 1, accommodated in a ceramic package.

FIG. 2 shows the condition where the acceleration sensor is accommodated in a ceramic package.

The signal processing section 20 is accommodated as an IC chip in the package 50. IC chip 20 has one side along which adjusting pads a–d and A–D are arrayed in line. The common pad 30 is elongated in parallel to the above-described one side of IC chip 20, so that the common pad 30 confronts with these adjusting pads a–d and A–D arrayed in line. Such a confronting layout of adjusting pads a–d, A–D and common pad 30 is advantageous to make the bonding operation easy.

Although FIG. 1 shows two separate common pads 30 and 30, using a single common pad as shown in FIG. 2 is effective to reduce the overall area of the common pad.

A connecting terminal 51, comprising an electric power terminal, an earthing terminal, an output terminal etc., is provided at an outer peripheral side of package 50. The components accommodated inside the package 50, such as sensor chip 10, IC chip 20 etc., are electrically connected to outer circuits or devices (not shown) through connecting terminal 51. The common pad 30 is connected to the earthing terminal.

In the drawing, reference numeral 25a represents a capacitor which constitutes HPF 23 shown in FIG. 1.

The acceleration sensor shown in FIG. 2 is in a condition where the glass sealing is not applied yet. After adjusting the amplification factor later-described, package 50 is applied the glass sealing. Alternatively, it is possible to apply gold plating on the upper surface of package 50 and fix a cap by soldering.

Figure 3:
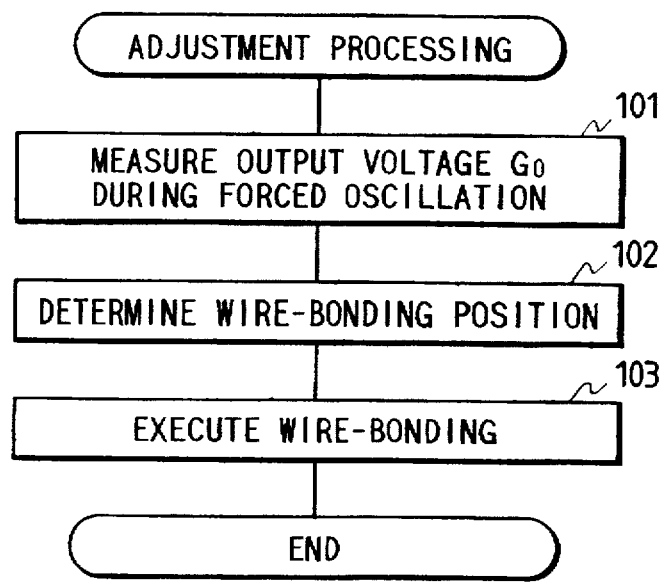
FIG. 3 is a flow chart showing the procedure of adjusting the amplitude factor of the amplification circuit.

Next, the amplification factor adjustment of the above-described amplification circuit 22 will be explained with reference to the flow chart of FIG. 3.

First of all, the acceleration sensor shown in FIG. 2 is subjected to a predetermined acceleration by the sin wave forced oscillation. Through this forced oscillation, the signal processing section 20 generates a.c. output voltage $G_0$. The P—P value of this output voltage $G_0$ is measured (Step 101).

Figures 4, 5:
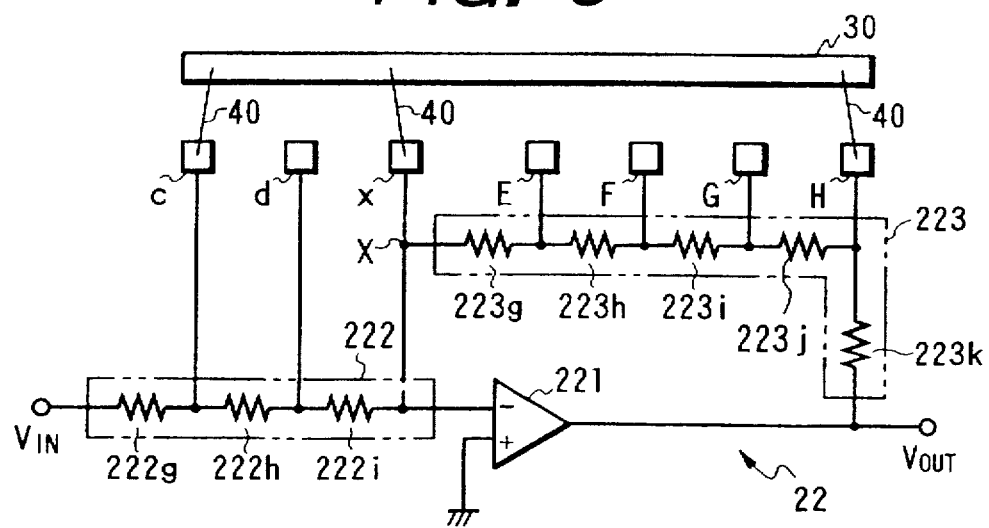
FIG. 4 is a map used in determining the bonding position in relation to the P—P value of output voltage $G_0$.
FIG. 5 is a circuit view showing the arrangement of an amplification circuit in accordance with another embodiment of the present invention.

Next, using the map shown in FIG. 4, the wire-bonding position is determined in accordance with the P—P value of output voltage $G_0$ (Step 102).

Then, the wire-bonding is performed at the position determined in the above step (Step 103). For example, when the P—P value of output voltage $G_0$ in somewhere between V2 and V3, adjusting pads a and A are bonded to common pads 30 as a pair of selected pads.

If the above-described wire-bonding adjustment is failed, wire-bonding will be easily performed again.

In general, wire-bonding is always used in the manufacturing of integrated circuits. Thus, the wire-bonders can be commonly used in the ordinary manufacturing process of integrated circuits and in the adjusting process of the amplification factors of amplification circuits.

FIG. 5 shows the circuit arrangement of an amplification circuit in accordance with another embodiment of the present invention. The amplification circuit shown in FIG. 5 is an inverting amplification circuit which is different from the non-inverting amplification circuit shown in FIG. 1.

The inverting amplification circuit shown in FIG. 5 comprises input resistance unit 222 consisting of a group of input resistances 222g through 222i and feedback resistance unit 223 consisting of a group of feedback resistances 223g through 223k. According to the circuit arrangement shown in FIG. 5, the electric potential of a connecting point X between input resistance unit 222 and feedback resistance unit 223 serves as a reference voltage. The pad x corresponding to the connecting point X is securely fixed to common pad 30 by the wire-bonding.

Other adjusting pads c, d, E–H and common pad 30 are selectively wire-bonded to obtain a desirable amplification factor in the same manner as in the above-described embodiment of FIG. 1.

For example, when adjusting pads c and H are selected and bonded via wires 40 to common pad 30, the amplification factor ($V_{OUT}/V_{IN}$) of the amplification circuit 22 is expressed by the following equation.

$$\frac{V_{OUT}}{V_{IN}} = -\frac{R_k}{R_g} \quad (3)$$

where $R_k$ represents a resistance value of resistance 223k and $R_g$ represents a resistance value of resistance 222g.

According to the circuit arrangement of FIG. 5, the number of possible combinations between the input resistance value and the feedback resistance value is 3×5=15 in view of the number of combinable adjusting pads c, d and E–H.

Above-described embodiments are based on the acceleration sensors having resistance values variable in accordance with acceleration. However, it is needless to say that the present invention can be applied to acceleration sensors whose capacities vary in accordance with acceleration.

In the above-described embodiments, the input resistance unit 222 and feedback resistance unit 223 are both adjusted. However, it is of course possible to adjust either one of these input and feedback resistances 222 and 223.

Furthermore, the present invention is not limited to acceleration sensors and can be used to adjust the sensitivity of various sensors, such as pressure sensors, photo sensors and others.

As this invention may be embodied in several forms without departing from the spirit of essential characteristics thereof, the present embodiments described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. An amplification circuit comprising:
   an operational amplifier;
   an input resistance unit and a feedback resistance unit used for determining an amplification factor of said operational amplifier, said input resistance unit consisting of a plurality of input resistances and said feedback resistance unit consisting of a plurality of feedback resistances;
   a plurality of adjusting pads provided at respective connecting points of said input resistances and said feedback resistances;
   a common pad having an electrical potential fixed at a reference voltage;
   a first wire for selectively bonding one of adjusting pads corresponding to said input resistances with said common pad to set a resistance value of said input resistance unit; and
   a second wire for selectively bonding one of adjusting pads corresponding to said feedback resistances with said common pad to set a resistance value of said feedback resistance unit.

2. An amplification circuit comprising:
   an operational amplifier, an input resistance unit and a feedback resistance unit used for determining an amplification factor of said operational amplifier, which are arranged as an integrated circuit and accommodated in a package;
   said input resistance unit consisting of a plurality of input resistances and said feedback resistance unit consisting of a plurality of feedback resistances;
   a plurality of adjusting pads provided at respective connecting points of said input resistances and said feedback resistances, said plurality of adjusting pads being arrayed along a line on said integrated circuit;
   a common pad having an electrical potential fixed at a reference voltage, said common pad being disposed in a confronting relationship with said line along which said plurality of adjusting pads are arrayed;
   a first wire for selectively bonding one of adjusting pads corresponding to said input resistances with said common pad to set a resistance value of said input resistance unit; and
   a second wire for selectively bonding one of adjusting pads corresponding to said feedback resistances with said common pad to set a resistance value of said feedback resistance unit.

3. The amplification circuit in accordance with claim 1, wherein said common pad is grounded.

4. An amplification circuit comprising:
   an operational amplifier;
   at least one resistance unit used for determining an amplification factor of said operational amplifier, said resistance unit consisting of a plurality of resistances connected in series;
   a plurality of adjusting pads provided at respective connecting points of said resistances connected in series;
   a common pad having an electrical potential fixed at a reference voltage; and
   a wire for selectively bonding one of adjusting pads corresponding to said resistances with said common pad to set a resistance value of said resistance unit.

5. A sensor apparatus comprising:
   sensor means for detecting a physical quantity and outputting a detection voltage;
   signal processing circuit for processing the detection voltage obtained from said sensor means;
   said signal processing circuit comprising an amplification circuit amplifying said detection voltage, said amplification circuit comprising:
   an operational circuit;
   at least one resistance unit used for determining an amplification factor of said operational amplifier, said resistance unit consisting of a plurality of resistances;

a plurality of adjusting pads provided at respective connecting points of said resistances;

a common pad having an electrical potential fixed at a reference voltage; and a wire for selectively bonding one of adjusting pads corresponding to said resistances with said common pad to set a resistance value of said resistance unit.

6. The sensor apparatus in accordance with claim 5, wherein said sensor means comprises a bridge circuit changing said detection voltage in response to the physical quantity.

7. A sensor apparatus comprising:

sensor means for detecting a physical quantity and outputting a detection voltage;

signal processing circuit for processing the detection voltage obtained from said sensor means;

said signal processing circuit comprising an amplification circuit amplifying said detection voltage, said amplification circuit comprising:

an operational circuit;

an input resistance unit and a feedback resistance unit used for determining an amplification factor of said operational amplifier, said input resistance unit consisting of a plurality of input resistances connected in series and said feedback resistance unit consisting of a plurality of feedback resistances connected in series;

a plurality of adjusting pads provided at respective connecting points of said input resistances and said feedback resistances;

a common pad having an electrical potential fixed at a reference voltage;

a first wire for selectively bonding one of adjusting pads corresponding to said input resistances with said common pad to set a resistance value of said input resistance unit; and a second wire for selectively bonding one of adjusting pads corresponding to said feedback resistances with said common pad to set a resistance value of said feedback resistance unit.

8. The sensor apparatus in accordance with claim 7, wherein said signal processing circuit is arranged as an integrated circuit, said adjusting pads corresponding to said input and feedback resistances are arrayed along a line on said integrated circuit, said integrated circuit, said sensor means and said common pad are accommodated in a package, and said common pad is disposed in a confronting relationship with said line along which said plurality of adjusting pads are arrayed.

9. A method for adjusting an amplification factor of an amplification circuit incorporated in a sensor apparatus, which comprises sensor means for detecting a physical quantity and outputting a detection voltage, signal processing circuit for processing the detection voltage obtained from said sensor means, said signal processing circuit comprising an amplification circuit amplifying said detection voltage, said amplification circuit comprising an operational circuit, at least one resistance unit used for determining an amplification factor of said operational amplifier, said resistance unit consisting of a plurality of resistances, a plurality of adjusting pads provided at respective connecting points of said resistances, a common pad having an electrical potential fixed at a reference voltage, and a wire for selectively bonding one of adjusting pads corresponding to said resistances with said common pad to set a resistance value of said resistance unit, said method comprising the steps of:

detecting an output signal of said sensor apparatus when said sensor means detects a predetermined physical quantity;

determining a bonding position of said wire based on said output signal with reference to a predetermined relationship between the output voltage and the bonding position; and executing a wire-bonding operation based on the determined bonding position.

* * * * *